(12) United States Patent
Reznik et al.

(10) Patent No.: US 7,678,603 B2
(45) Date of Patent: Mar. 16, 2010

(54) VIA WAVE GUIDE WITH CURVED LIGHT CONCENTRATOR FOR IMAGE SENSING DEVICES

(75) Inventors: Hai Reznik, Migdal Haemek (IL); Amos Fenigstein, Migdal Haemek (IL); Doron Amihood, Migdal Haemek (IL); David Choen, Migdal Haemek (IL)

(73) Assignee: Tower Semiconductor Ltd., Migdal Haemek (IL)

( * ) Notice: Subject to any disclaimer, the term of this patent is extended or adjusted under 35 U.S.C. 154(b) by 26 days.

(21) Appl. No.: 12/037,893

(22) Filed: Feb. 26, 2008

(65) Prior Publication Data

US 2008/0145965 A1    Jun. 19, 2008

Related U.S. Application Data

(62) Division of application No. 11/361,417, filed on Feb. 24, 2006, now Pat. No. 7,358,583.

(51) Int. Cl.
*H01L 27/13* (2006.01)
(52) U.S. Cl. .............................. 438/65; 438/66; 438/69; 438/70; 438/71; 438/72; 257/222
(58) Field of Classification Search ................ 257/215, 257/222, 225, 233, 431–437, 440, 443, E27.13, 257/E27.131–E27.135; 438/65, 66, 69–72, 438/75–79, 706
See application file for complete search history.

(56) References Cited

U.S. PATENT DOCUMENTS

| | | | |
|---|---|---|---|
| 5,180,689 A * | 1/1993 | Liu et al. ..................... | 438/640 |
| 7,060,961 B2 | 6/2006 | Dobashi et al. | |
| 7,135,666 B2 | 11/2006 | Dobashi | |
| 7,193,289 B2 | 3/2007 | Adkisson et al. | |
| 2004/0004668 A1 | 1/2004 | Namazue et al. | |
| 2005/0236553 A1 | 10/2005 | Noto et al. | |
| 2005/0253045 A1 | 11/2005 | Oda | |
| 2005/0274871 A1 | 12/2005 | Li et al. | |
| 2006/0054946 A1 | 3/2006 | Baek et al. | |
| 2006/0081848 A1 | 4/2006 | Niisoe et al. | |
| 2006/0113622 A1 * | 6/2006 | Adkisson et al. ............ | 257/443 |
| 2006/0115230 A1 | 6/2006 | Komoguchi et al. | |
| 2006/0138495 A1 | 6/2006 | Li et al. | |

* cited by examiner

*Primary Examiner*—Zandra Smith
*Assistant Examiner*—Paul E Patton
(74) *Attorney, Agent, or Firm*—Bever, Hoffman & Harms, LLP; Patrick T. Bever (57) ABSTRACT

A CMOS image sensor (CIS) device includes an array of pixels, each pixel including a sensing element (e.g., a photodiode) and access circuitry. To facilitate the passage of light to the photodiode, each pixel includes a via wave guide (VWG) defined in the metallization layer formed over the pixel's photodiode. The VWG includes an upper light concentrator having a curved (e.g., parabolic) surface extending from a relatively wide upper opening to a relatively small lower opening. The VWG also includes a lower section extending between the lower opening of the light concentrator and the associated photodiode. A mirror coating is optionally formed on the surface of the VWG. An optional light-guiding material and/or color filter materials are disposed inside the VWG. An optional microlens is formed over the VWG.

8 Claims, 5 Drawing Sheets

VIA WAVE GUIDE WITH CURVED LIGHT CONCENTRATOR FOR IMAGE SENSING DEVICES

RELATED APPLICATIONS

This application is a divisional of U.S. patent application Ser. No. 11/361,417, entitled "Via Wave Guide With Curved Light Concentrator For Image Sensing Devices" filed Feb. 24, 2006.

FIELD OF THE INVENTION

The present invention relates to solid state image sensors. More specifically, the present invention relates to CMOS image sensors (CISs) having via wave guides, and to methods for making such CISs.

BACKGROUND OF THE INVENTION

Solid state image sensors are used, for example, in video cameras, and are presently realized in a number of forms including charge-coupled devices (CCDs) and CMOS image sensors (CISs). CISs sensors are based on a two dimensional array of pixels that are fabricated using CMOS fabrication techniques. Each CIS pixel includes a sensing element (e.g., a photodiode) and access circuitry that are fabricated on a semiconductor substrate, and connected to control circuits by way of metal address and signal lines. These metal lines are supported in insulation material that is deposited over the upper surface of the semiconductor substrate, and positioned along the peripheral edges of the pixels to allow light to pass between the metal lines to the sensing elements through the insulation material. In color image sensors, each pixel also includes a color filter located over the sensing element. An array of microlenses is sometimes located over the metallization layer to focuses light from an optical image through the color filter and the insulation material into the image sensing elements. Each image sensing element is capable of converting a portion of the optical image passed by the color filter into an electronic signal. The electronic signals from all of the image sensing elements are then used to regenerate the optical image on, for example, a video monitor.

The quality of an image generated by a conventional CIS is at least in part determined by the amount of light that reaches the photodiode of each pixel. As indicated above, the photodiode of each pixel covers only a portion of the entire pixel area, with the access circuitry and address/signal lines taking up the remaining CIS surface area. Accordingly, in the absence of microlenses, only a portion of the light incident on the upper surface of the CIS is captured by the photodiodes. Further, when color filters are present, only a portion of the light directed toward a particular photodiode is passed by the color filter, further reducing the amount of captured light that can be used to generate image information. Moreover, because the light must pass through the semi-opaque insulation material of the metallization layer, a portion of the filtered light directed toward each photodiode is reflected or refracted away from the photodiode. Some of this reflected/refracted light may strike an adjacent photodiode, producing blurring and/or inaccurate image color.

What is needed is a CIS that facilitates enhanced image detection by providing a structure for capturing and concentrating substantially all of the light incident on the CIS, and directing the concentrated light onto the CIS's photodiodes.

SUMMARY OF THE INVENTION

The present invention is directed to image sensors (e.g., CMOS image sensors (CISs)) in which each pixel includes a via wave guide defined in the metallization layer disposed over the pixel's photodiode, where each via wave guide includes a relatively large light concentrator formed over the metal lines of the metallization layer, and a relatively narrow lower section extending between the light concentrator and the pixel's photodiode through the space separating the metal lines. In accordance with the present invention, the light concentrator includes a curved (e.g., parabolic) surface shaped such that light beams directed into the light concentrator are redirected by a suitable light-guiding material layer formed on the curved surface into the lower section and toward the photodiode. By forming via wave guides for each pixel in which the light concentrator has an upper opening that is substantially as large as the area occupied by the associated pixel, the present invention facilitates enhanced image detection because substantially all of the light directed onto the CIS is concentrated and directed onto the CIS's photodiodes. In addition, because the via wave guides facilitate the substantially transparent passage for light passing through the metallization layer to the photodiode, the thickness of the metallization layer is less of an issue than in conventional arrangements, and as such the present invention facilitates the production of complex image sensors having four or more layers of metal lines over the control circuitry located on the array periphery.

In accordance with an aspect of the present invention, each via wave guide is filled with a light-guiding material that facilitates passage of light to the pixel's photodiode. In one embodiment, the light-guiding material has a higher refractive index than a refractive index of insulation material utilized to form the surrounding metallization layer. When disposed in the light concentrator section of the via wave guide, this high refractive index (high-RI) material facilitates redirecting light beams into the lower section of the via wave guide by refracting (bending) the light beams in a manner defined by the curved surface of the light concentrator.

In accordance with an optional aspect of the present invention, the light-guiding material comprises a mirror coating disposed over at least one of the curved surface of the light concentrator and a peripheral surface of the lower section. The mirror coating located in the light concentrator has a curved shape defined by the curved surface of the light concentrator, thus facilitating the reflection of light beams entering the light concentrator into the lower section of the via wave guide. The light beams are further reflected by the mirror coating formed on a peripheral wall of the lower section toward the pixel's photodiode. In one embodiment, the mirror coating is formed over a passivation layer. In another embodiment, a transparent light-guiding material is disposed on a surface of the mirror coating.

In accordance with an optional aspect of the present invention, a color filter material is inside at least one of the curved surface of the light concentrator and a peripheral surface of the lower section. By placing the color filter material inside the via wave guide, the filtered light travels a shorter distance to the photodiode, thus reducing the chance of color inaccuracies. In one embodiment, the color material is mixed with a light-guiding material.

In accordance with an optional aspect of the present invention, a microlens is optionally disposed over the via wave guide to further facilitate the capture and concentration of light directed toward the host CIS.

In accordance with another embodiment of the present invention, a process for forming via wave guides includes dry etching a relatively shallow hole into an upper insulation layer over a pixel's photodiode, and then applying a wet etch into the hole in a manner that produces a light concentrator having the desired curved (e.g. parabolic) surface. A subsequent dry etch is then utilized to produce the lower section of the via wave guide.

BRIEF DESCRIPTION OF THE DRAWINGS

These and other features, aspects and advantages of the present invention will become better understood with regard to the following description, appended claims, and accompanying drawings, where:

DETAILED DESCRIPTION OF THE DRAWINGS

The present invention relates to an improvement in CIS devices involving an improved via wave guide. The following description is presented to enable one of ordinary skill in the art to make and use the invention as provided in the context of a particular application and its requirements. As used herein, directional terms such as "upper", "upwards", "lower", "downward", "front", "rear", are intended to provide relative positions for purposes of description, and are not intended to designate an absolute frame of reference. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Figure 1:
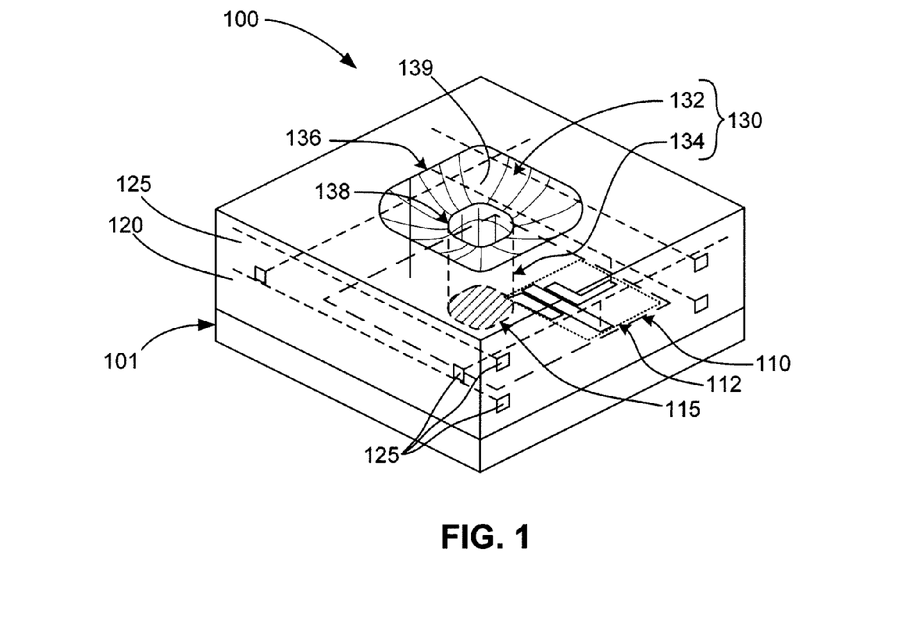
FIG. 1 is a top side perspective view showing a portion of a CIS including a pixel having a via wave guide formed in accordance with an embodiment of the present invention.
Figure 2:
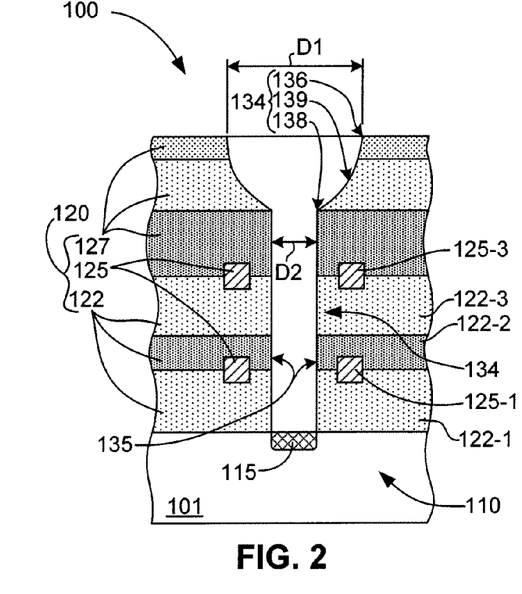
FIG. 2 is a cross-sectional side view showing a portion of the CIS pixel of FIG. 1.

FIGS. 1 and 2 are perspective and cross-sectional side views showing a portion of a CMOS image sensor (CIS) 100 according to an embodiment of the present invention. CIS 100 generally includes a semiconductor (e.g., monocrystalline silicon) 101, and an array of pixels 110 (one shown) and a metallization layer 120 that are formed on and over substrate 101 according to known CMOS fabrication techniques. As indicated in FIG. 1, each pixel 110 includes access circuitry (e.g., an access transistor 112) and a photodiode (sensing element) 115 that are formed in a predefined assigned area (indicated by dashed square) on the upper surface of substrate 101. As indicated in FIG. 2, metallization layer 120 includes a series of insulating layers and metal lines that are formed over substrate 101. As defined herein, metallization layer 120 includes one or more lower insulation layers 122 that support one or more metal lines 125, and one or more upper insulation layers 127 that are formed over the uppermost metal lines 125. For example, as indicated in FIG. 2, lower insulating layers 122-1, 122-2, and 122-3 are respectively formed on an upper surface of substrate 101, with a first layer of metal lines (including metal line 125-1) supported between insulating layers 122-1 and 122-2, and a third layer of metal lines (including uppermost metal line 125-3) supported on insulating layer 122-3.

A via wave guide (VWG) 130 is defined in metallization layer 120 over each pixel 110, and serves to guide light beams through metallization layer 120 to associated photodiode 115. In accordance with the present invention, VWG 130 includes both relatively wide light concentrator section 132 that is defined in upper insulation layers 127 (i.e., above uppermost metal lines 125-3), and a relatively narrow lower section 134 that is defined in lower insulation layers 122.

Figure 3:
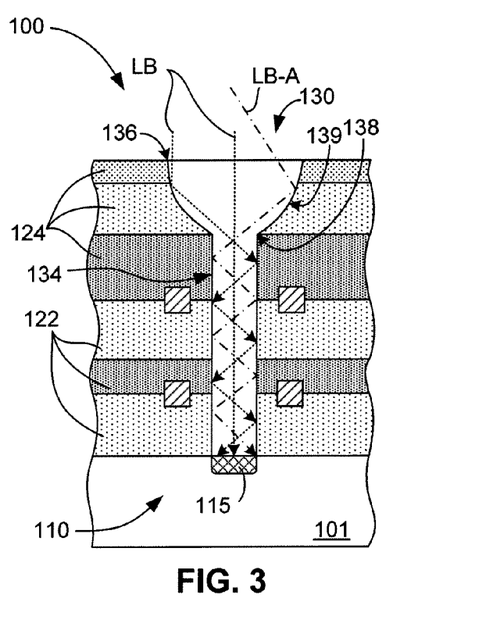
FIG. 3 is a cross-sectional side view depicting the CIS pixel of FIG. 1 during operation.

As indicated in FIG. 2, light concentrator 132 includes an upper opening 136 having a relatively large diameter D1, a lower opening 138 having a relatively small diameter D2, and a curved (e.g., parabolic) surface 139 that tapers in a continuous smooth curve between upper opening 136 and lower opening 138. In one embodiment, upper opening 136 is substantially equal in size to the area (depicted by the dashed square in FIG. 1) associated with pixel 110. As indicated in FIG. 3, light concentrator 132 is shaped such that, when curved surface 139 is coated with a suitable light-guiding (e.g., reflecting or refracting) material, light beams LB directed toward pixel 110 are redirected by curved surface 139 through the lower opening 138 and into lower section 134. In particular, relatively wide upper opening 136 and curved surface 139 facilitate capturing a relatively large amount of light directed toward pixel 110, and facilitate redirecting (i.e., by providing a suitable surface angle for the light-guiding material) the captured light toward lower section 134, thereby effectively concentrating the captured light. As discussed in additional detail below, when filled with light-guiding materials having a relatively high refractive index (RI), or when coated with mirror materials, the VWG both maximizes the amount of light reaching associated photodetector 115, and minimizes cross-talk with neighboring pixels (not shown). In addition as depicted in FIG. 3 by dashed-dot-lined arrow LB-A, another benefit of the present invention is that curved surface 139 enables the capture and concentration of a wide range of incident light angles without the use of microlenses. Accordingly, VWG 130 facilitates enhanced image detection because substantially all of the light directed onto CIS 100 is concentrated and directed onto the CIS's photodiodes (e.g., photodiode 115).

Referring to FIG. 2, in accordance with an embodiment of the present invention, lower section 134 of VWG 130 is substantially vertically aligned in lower insulating section 122 of metallization layer 120, and extends between lower opening 134 of light concentrator 132 and photodiode 115. A peripheral surface 135 of lower section 134, which is defined by the surrounding insulation material, defines one of a substantially square cross-section, a substantially circular cross-section, and a substantially octagonal cross-section, depending on the fabrication process technique utilized to etch the insulation material.

Figure 4A:
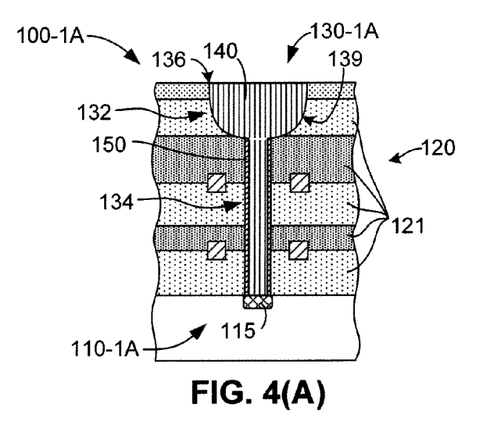
FIGS. 4(A) and 4(B) are cross-sectional side views showing CIS pixels including via wave guides having high refractive index light-guiding materials in accordance with alternative embodiments of the present invention.
Figure 4B:
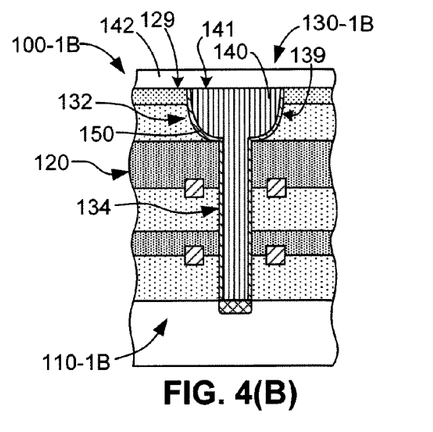

FIGS. 4(A) and 4(B) are cross-sectional side views showing portions of a CIS 100-1A and a CIS 100-1B that include pixels 110-1A and 110-1B, respectively, which in turn include VWG 130-1A and 130-1B, respectively. VWG 130-1A and VWG 130-1B differ from VWG 130 (described above) in that they include a mirror coating 150 disposed on at least one of curved surface 139 of light concentrator 132 and peripheral surface 135 of VWG lower section 134, and has a high refractive index (high-RI) light-guiding material 140 disposed in their respective light concentrators, which are formed in the manner described above to include curved surface 139. As defined herein, high-RI light-guiding material 140 has a higher refractive index than the refractive index of insulation material 121 forming the various layers of metallization layer 120. In an exemplary embodiment, high-RI light-guiding material 140 includes at least one of silicon-nitride (SiN) and titanium-oxide (TiO2) based polymers. Referring to FIG. 4(A), in one embodiment, VWG 130-1A includes high-RI material 140 disposed in both light concentrator 132 and in lower section 134, and mirror coating 150 is disposed only on peripheral surface 135 of VWG lower section 134. In the alternative embodiment shown in FIG. 4(B), VWG 130-1B includes both high-RI material 140 and mirror coating 150 disposed in light concentrator 132 and lower section 134. VWG 130-1B also includes an optional anti-reflective coating (layer) 142 (e.g., silicon-on-glass (SOG) or any other material with a lower refractive index than that of the high-RI material) formed on upper surface 141 and upper surface 129 of metallization layer 120. Anti-reflective coating 142 is particularly useful when mirror coating 150 is a relatively low reflectance material (e.g., tantalum or titanium, versus a relatively highly reflective material such as aluminum). In this case, high-RI material 140 produces only one reflection (or a minimum number of reflections) from mirror coating 150, thereby reducing the light loss when the light hits mirror coating 150. In this instance, anti-reflective coating 142 serves to minimize the reflectance losses from the transition between air and hi-RI layers. The embodiment illustrated in FIG. 4(B) may be further modified to include the color filter material (not shown) in the manner described below, or disposed over anti-reflective coating 142. In another alternative embodiment (not shown), lower section 134 is filled with a transparent light-guiding material 145 having a refractive index that is relatively low in comparison to that of high-RI material 140. Suitable transparent materials 145 include, for example, silicon-dioxide (SiO$_2$) and spin-on glass, which is typically used only if lower section 134 is covered with a mirror.

Figure 5A:
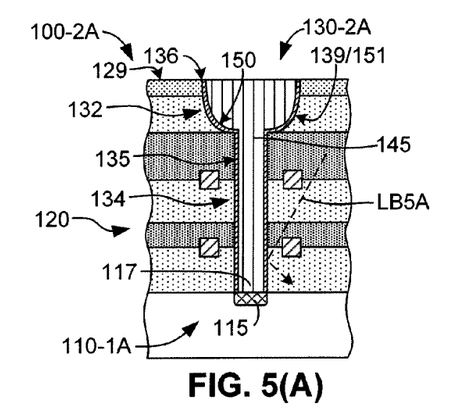
FIGS. 5(A), 5(B), and 5(C) are cross-sectional side views showing CIS pixels including via wave guides having mirror coatings formed in accordance with additional alternative embodiments of the present invention.

FIG. 5(A) is a cross-sectional side view showing a portion of a CIS 100-2A that includes a pixel 110-2A, which in turn includes a VWG 130-2A that is formed in accordance with another embodiment of the present invention. VWG 130-2A differs from VWG 130 (described above) in that VWG 130-2A includes a mirror coating 150 disposed on at least one of curved surface 139 of light concentrator 132 and peripheral surface 135 of VWG lower section 134. As defined herein, mirror coating 150 is characterized as being substantially fully reflective to light beams entering through upper opening 136. In an exemplary embodiment, mirror coating 150 includes at least one of aluminum, tantalum, tungsten, titanium, silver, gold, platinum, and copper. When formed in light concentrator 132, an outer surface 151 of mirror coating 150 is substantially coincident with and shaped by curved surface 139 to form, for example, a parabolic mirror structure that reflects light entering through upper opening 136 into lower section 134, thereby facilitating efficient concentration and transmission of light entering onto photodiode 115. When light-reflective material is disposed on the surfaces of both light concentrator 132 and lower section 134, as shown in FIG. 5(A), mirror coating 150 effectively forms light-capturing and concentrating mirror tunnel that directs substantially all of the light beams directed toward upper surface 129 over pixel 110-1A to its photodiode 115. Further, the lower portion of mirror coating 150 substantially shields photodiode 115 from receiving "stray" light beams (e.g., light beam LB5A) that enter metallization layer 120 outside of mirror coating 150, whereby cross talk between adjacent pixels can be entirely eliminated. VWG 130-2A also includes and optional transparent light-guiding material 145 (e.g., an amorphous polymer or a dielectric material) that is disposed on an inside surface of mirror coating 150 in at least one of lower section 134 and light concentrator 132. The presence of light-guiding material 145 provides protection for photodiode 115 and a stable base for structures formed over metallization layer 120, and further serves to enhance light concentration. In an alternative embodiment, the area inside mirror coating 150 may remain empty (i.e., air filled).

Figure 5B:
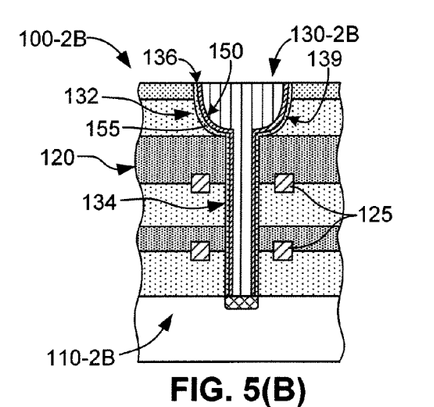

FIG. 5(B) is a cross-sectional side view showing a portion of a CIS 100-2B that includes a pixel 110-2B, which in turn includes a VWG 130-2B that is formed in accordance with yet another embodiment of the present invention. VWG 130-2B differs from VWG 130-2A in that VWG 130-2B includes a passivation layer 155 that is disposed between metallization layer 120 and mirror coating 150. Passivation layer 155 includes, for example, silicon nitride and silicon dioxide, and serves to provide a smooth surface for mirror coating 150, and to provide electrical insulation between mirror coating 150 and the metal lines 125 when metal lines 125 are unintentionally exposed during the VWG etch process.

Figure 5C:
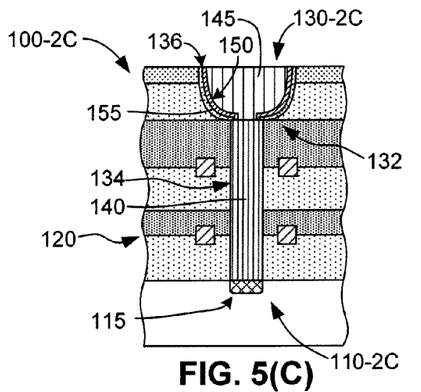

FIG. 5(C) is a cross-sectional side view showing a portion of a CIS 100-2C that includes a pixel 110-2C, which in turn includes a VWG 130-2C that is formed in accordance with yet another embodiment of the present invention. VWG 130-2C includes mirror coating 150 and optional passivation layer 155, described above. However, mirror coating 150 is disposed only on curved surface 139 of the light concentrator 132 (i.e., not on peripheral wall 135 of lower section 134), and high-RI light-guiding material 140 (described above) is disposed in lower section 134. In addition, VWG 130-2C includes an optional transparent light-guiding material 145 (e.g., an amorphous polymer or a dielectric material) that is disposed on an inside surface of mirror coating 150 in light concentrator 132.

FIGS. 6(A) to 6(D) are cross-sectional side views showing portions of CIS 100-3A to 100-3D that include pixels 110-3A to 110-3D, respectively, which in turn include VWGs 130-3A and 130-3D, respectively. Each VWG 130-3A to 130-3D includes a light concentrator 132 and a lower section 134 that are substantially as described above. However, VWGs 130-3A to 130-3D differ from previous embodiments in that they include a color filter material 160 disposed in at least one of light concentrator 132 and lower section 134. The benefit of disposing color filter material 160 inside VWGs 130-3A to 130-3D is that this arrangement facilitates color filtering in close proximity to the associated photodiode 115, thereby avoiding cross-talk in the form of light passed by adjacent color filters from generating inaccurate detection by associated color filter 115. Note, however, that the thickness $T_{CFM}$ of color filter material 160 is preferably substantially equal to the thickness of color filters in conventional arrangements, unless the color filter material is mixed/diluted (as described below with reference to FIG. 6(D)).

Figure 6A:
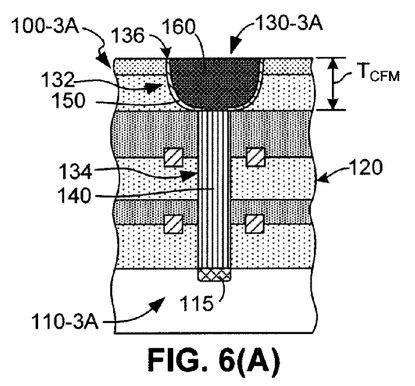
FIGS. 6A), 6(B), 6(C) and 6(D) are cross-sectional side views showing CIS pixels including via wave guides having color filter materials formed in accordance with further additional alternative embodiments of the present invention.

FIG. 6(A) depicts a VWG 130-3A formed in accordance with a first exemplary embodiment, where VWG 130-3A includes a high-RI light-guiding material 140 disposed in lower section 134, and color filter material 160 is deposited over a mirror coating 150, which is formed in the manner described above, where both mirror coating 150 and color filter material 160 are disposed in light concentrator 132. In this arrangement, high-RI light-guiding material 140 serves to support color filter 160, thus simplifying the color filter formation process. In one embodiment, color filter material 160 is either formed from or mixed with a high refractive index material to facilitate concentration and transmission of light into lower section 134. As mentioned above, the height of light concentrator 132 is selected to equal the conventional color filter thickness $T_{CFM}$. In another alternative embodiment, a SOG topcoat (not shown) is formed over VWG 130-3A to protect the exposed CFA material from damage and/or contamination. The optional SOG topcoat may also be used to open the pads after the formation of the VWG.

Figure 6B:
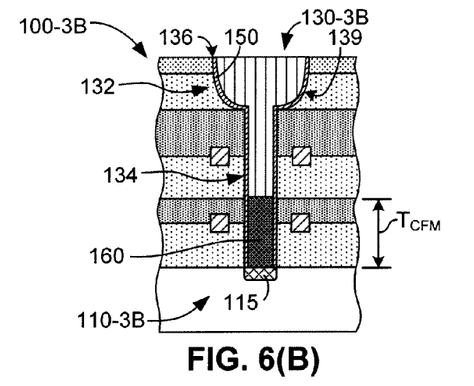

FIG. 6(B) depicts a VWG 130-3B formed in accordance with a second exemplary embodiment, where VWG 130-3B includes color filter material 160 disposed in lower section 134 such that a distance between color filter material 160 and photodiode 115 is minimized. In one embodiment, color filter material 160 is deposited in lower section 134 and then etched to provide the required thickness $T_{CFM}$. VWG 130-3B also includes mirror coating 150 disposed on curved wall 139 and along lower section 134 between light concentrator 132 and color filter material 160. With this arrangement, substantially all light entering upper opening 136 is reflected by "full-length" mirror coating 150 through color filter material 160 onto photodiode 115, thereby completely eliminating cross-talk between adjacent color filtered pixels (e.g., green filtered light will only reach the photodiode located under the green filter material, and this photodiode will be shielded by the mirror coating from receiving light from red or blue filters, other green filters, or stray "white" light). As in previous embodiments, a transparent light-guiding material (not shown) may be optionally used to fill the otherwise empty space inside light concentrator 132 an in lower section 134 between above color filter material 160.

Figure 6C:
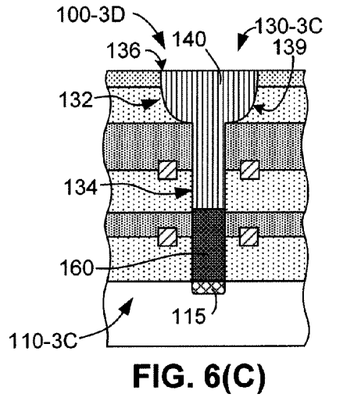

FIG. 6(C) depicts a VWG 130-3C formed in accordance with a third exemplary embodiment, where, similar to VWG 130-3B, VWG 130-3C includes a filtering material 160 disposed in lower section 134 in a way that minimizes the distance between color filter material 160 and photodiode 115. VWG 130-3C also includes high-RI light-guiding material 140 disposed on curved wall 139 and along lower section 134 between light concentrator 132 and color filter material 160. With this arrangement, most of the light entering upper opening 136 is refracted through color filter material 160 onto photodiode 115.

Figure 6D:
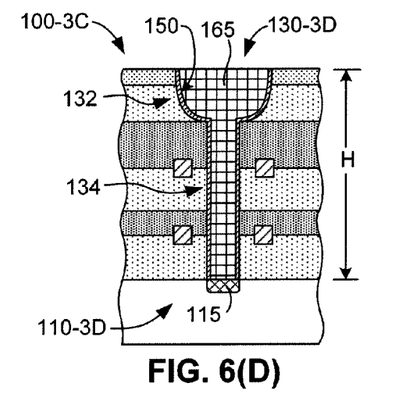

FIG. 6(D) depicts a VWG 130-3D formed in accordance with a third exemplary embodiment, where VWG 130-3D includes a color filter mixture 165 that is formed by dispersing (mixing or otherwise diluting) the color filter material (discussed above) in one of the light-guiding materials described above. Mixing the color filter material with the light-guiding material provides a benefit of eliminating the need for controlling the thickness of the color filter material. That is, as discussed above, when the color filter material is unmixed as shown in FIGS. 6(A) and 6(B), the thickness $T_{CFM}$ of the resulting color filter structure 160 must be etched or otherwise controlled to achieve the desired color filtering characteristic. By mixing the color filter material in an appropriate amount of one of the low RI transparent materials described above, the desired color filtering characteristic may be achieved without the need for performing a separate color filter etch. Note that the amount of transparent material (i.e., the level of dilution) is determined, e.g., by the overall height H of VWG 130-3D. Finally, mirror coating 150 is used in the manner described above to facilitate transmission of light to photodiode 115.

Figure 7A:
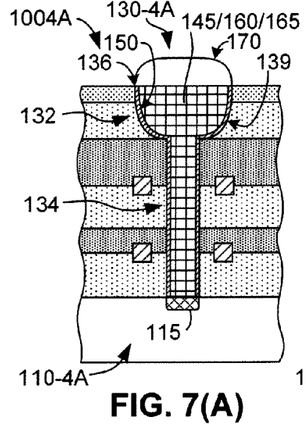
FIGS. 7(A), 7(B) and 7(C) are cross-sections showing CIS pixels including via wave guides having microlenses in accordance with further additional alternative embodiments of the present invention.
Figure 7B:
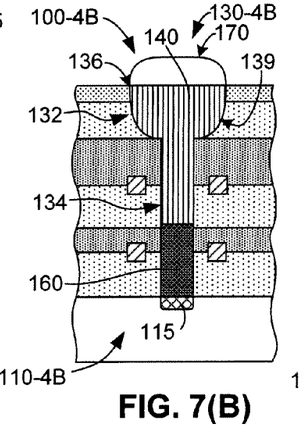
Figure 7C:
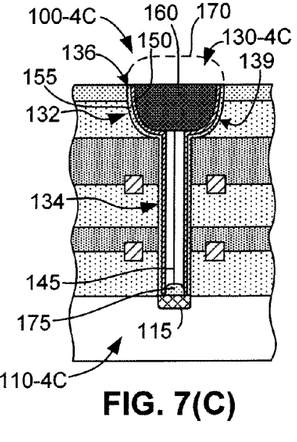

FIGS. 7(A) to 7(C) are cross-sectional side views showing portions of CIS 100-4A to 100-4C that include pixels 110-4A to 110-4C, respectively, which in turn include VWGs 130-4A and 130-4C, respectively. Each VWG 130-4A to 130-4C includes a light concentrator 132 and a lower section 134 that are substantially as described above. VWGs 130-4A and 130-4B differ from previous embodiments in that they include a microlens 170 disposed over upper opening 136 of light concentrator 132. As mentioned above, one advantage of the present invention is that the various VWGs reduce or eliminate the need for microlenses. However, in some applications the use of microlenses in conjunction with the VWGs of the present invention may provide superior performance.

In accordance with an aspect of the present invention, VWGs 130-4A and 130-4B are at least partially filled with a material capable of supporting microlenses 170. As indicated in the exemplary embodiment disclosed in FIG. 7(A), VWG 130-4A includes mirror coating 150 formed on curved surface 139 and along lower section 134. In addition, disposed inside mirror coating 150 are one or more of light guiding material 145, color filter material 160 and transparent/color filter mixture 165, which support microlens 170. In the alternative exemplary embodiment disclosed in FIG. 7(B), VWG 130-4B includes high-RI light-guiding material 140 disposed inside light concentrator 132 and color filter material 160 disposed in lower section 134, with microlens 170 disposed on light-guiding material 140. In an alternative embodiment (not shown), high-RI material is disposed in the lower section and color filter material is disposed in the upper section (in the tapered light concentrator), with a microlens disposed above the color filter material.

FIG. 7(C) shows another alternative embodiment of the present invention in which a VWG 130-4C includes a microlens 175 disposed inside lower section 134 directly over photodiode 115. Microlens 175 is formed, for example, by depositing resist inside lower section 134, and melting the photoresist using known techniques to produce a suitable lens structure. In one embodiment, microlens 175 is formed after the formation of mirror coating 150, which is depicted as being formed on passivation layer 155. Subsequent to the formation of microlens 175, one or more of transparent light-guiding material 145 and color filter material 160 may be formed in VWG 130-4C in the manner described above. As indicated by the dashed line structure, in another optional embodiment, a "big" microlens 170 is added above VWG 130-4C as in the previous embodiments to further focus light.

Figure 8A:
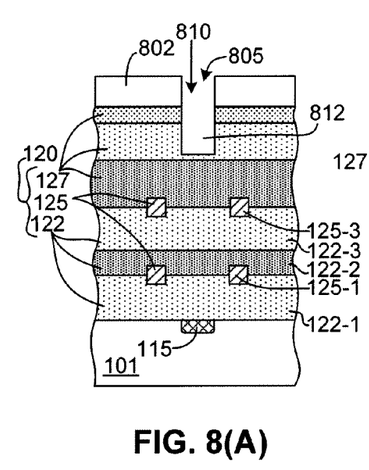
FIGS. 8(A), 8(B) and 8(C) are cross-sections showing a fabrication process for forming the curved light concentrator and the lower section of a via wave guide according to another embodiment of the present invention.
Figures 8B, 8C:
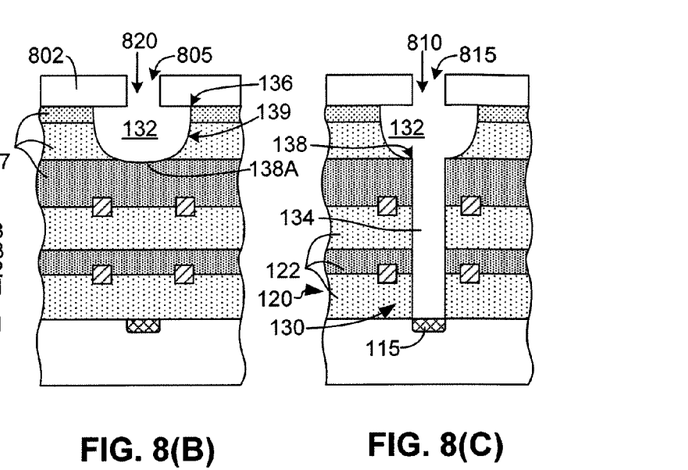

FIGS. 8(A) to 8(C) are cross-sectional side views illustrating a process for fabricating via wave guides according to another embodiment of the present invention.

Referring to FIG. 8(A), standard CMOS processes may be used to fabricate photodiode 115 and access circuitry (not shown) in substrate 101. Subsequently, metallization layer 120 is formed over substrate 101 using standard CMOS techniques such that metallization layer 120 includes lower insulation layers 122 and several layers of metal lines 125-1 to 125-3 respectively disposed between insulation layers 122-1 to 122-3 in the manner described above with reference to FIG. 1. After forming uppermost metal lines 125-3, one or more upper insulation layers 127 are formed according to standard CMOS fabrication techniques. In one embodiment, upper insulation layers 127 comprise silicon dioxide that may be covered by silicon-nitride.

In a first stage of the via wave guide formation process, a first mask 802 is formed over an upper surface of upper insulation layers 127, and a window (mask opening) 805 is patterned into mask 802 such that window 805 exposes an upper surface of upper insulation layers 127 and is located over photodiode 115. Next, a dry etching process is performed by applying a directional dry etchant 810 through window 805 that forms a precursor hole 812 in upper insulation layers 127. The size (i.e., width and depth) of precursor hole 812 is selected to facilitate the formation of the desired light concentrator, as described below. In one embodiment, precursor hole 812 a first, relatively short distance between the upper surface and the photodiode (relative to the final depth of the subsequently completed via wave guide).

Referring to FIG. 8(B), a wet etchant 820 is then applied over first mask 802 such that wet etchant 820 enters window 805 and etches upper insulation layer 127. By selectively matching the size of precursor hole 812 and the etching rate and time of wet etchant 820, the wet etching process is controlled to produce light concentrator 132 having curved walls 139 forming a substantially parabolic shape having a relatively wide upper opening 134 located adjacent to first mask 802, and tapering to a relatively narrow lower end 138A.

As shown in FIG. 8(C), following the wet etch used to form light concentrator 132, dry etchant 810 is again applied through mask opening 805 to define lower opening 138 of light concentrator 132, and to form lower section 134 in lower insulation layers 122. Note that lower section 134 extends substantially vertically between light concentrator 132 and photodiode 115, but may not extend all the way to photodiode 115 in the manner depicted (i.e., the etching process may be terminated before etching entirely through lower insulation layers 122 to prevent damage to photodiode 115). Note that, depending on the shape of window 805 and the applied power utilized during the dry etching process, lower section 134 is formed with a substantially uniform (e.g., substantially square, circular, or octagonal) cross-section.

Upon completing the dry etching process used to form lower section 134 that is described above with reference to FIG. 8(C), basic VWG 130 is defined in metallization layer 120 that may be further processed to form any of the various embodiments described above.

Figures 9A, 9B, 9C:
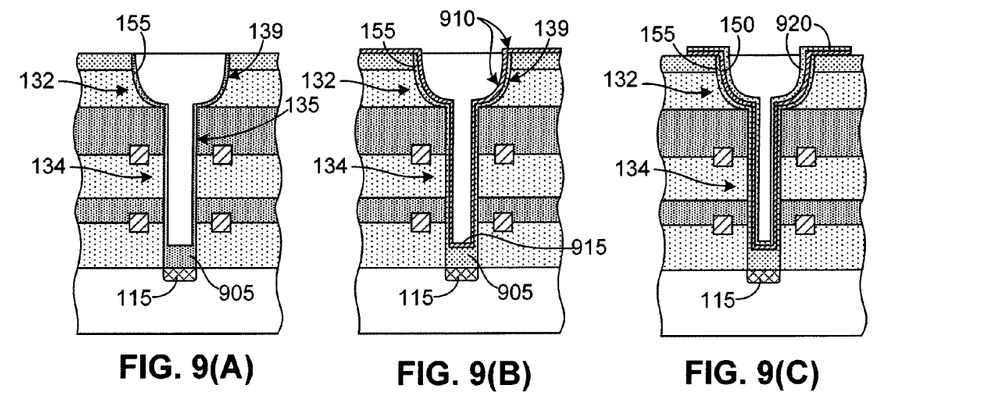
FIGS. 9(A), 9(B), 9(C), 9(D) and 9(E) are cross-sections showing a fabrication process for forming a mirror coating on the curved light concentrator and the lower section according to another embodiment of the present invention.
Figure 9D:
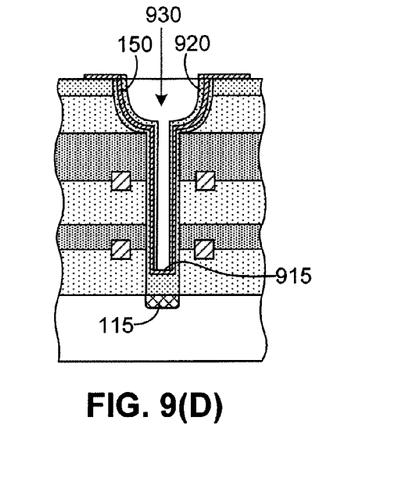
Figure 9E:
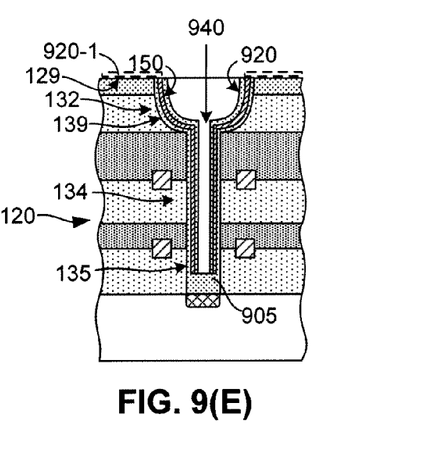

FIGS. 9(A) to 9(E) illustrate the formation of a mirror coating on curved surface 139 and peripheral wall 135 of VWG 130 according to an exemplary embodiment of the present invention. Referring to FIG. 9(A), a thin passivation layer 155 (e.g., SiO$_2$ on a thin layer of SiN) is deposited on curved surface 139 and peripheral wall 135 using standard techniques. Note that a lower portion 905 of passivation layer 155 is formed over photodiode 115. Next, as shown in FIG. 9(B), a light reflective material layer 910 is formed over passivation layer 155. In one embodiment, formation of light reflective material layer 910 involves depositing at least one metal selected from the group including aluminum, tantalum, tungsten, titanium, silver, gold, platinum, and copper by, for example, sputtering, chemical vapor deposition (CVD) (e.g., conformal coating such as aluminum CVD), evaporation, or re-sputter techniques (e.g., tantalum deposition and re-sputter). Note that a lower end portion 915 of light reflective material layer 910 is formed on lower portion 905 of passivation layer 155. FIG. 9(C) illustrates the subsequent step of forming a protective (masking) layer 920 (e.g., SiO$_2$) over light reflective material layer 910 using standard deposition techniques. As indicated in FIG. 9(D), a directional dry etch 930 is then utilized to remove the portions of protective layer 920 that are formed on horizontal surfaces, including the small portion of masking layer 920 formed over lower end portion 915 of light reflective material layer 910. Note that a portion of protective layer 920 remains attached to curved surface 139 of light collector 134, and that the selectivity of dry etch 930 may be set such that lower end portion 915 is etched faster than protective layer 920 after removing the protective material located over lower end portion 915. As shown in FIG. 9(E), a metal etchant 940, which is determined by the type of light reflective material utilized to form layer 910, is applied to remove the exposed portions of the light reflective material layer 910, thereby completing the formation of mirror coating 150 over curved surface 139 of light concentrator 132 and peripheral surface 135 of lower section 134. Although not indicated in subsequent figures, masking layer 920 is preferably left on mirror coating 150 following the metal etch. Also, in one embodiment, metal layer portions 920-1 formed over upper surface 129 (shown in dashed lines in FIG. 9(E)) are retained to prevent light from entering metallization layer 120 and potentially generating cross talk. Note that the above process for removing lower end portion 915 is exemplary, and those skilled in the art will recognize this removal process may be achieved using other known approaches.

Figure 10A:
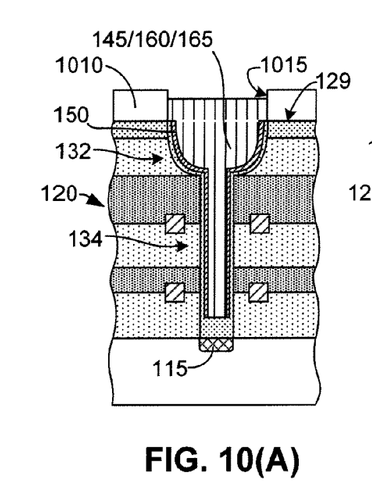
FIGS. 10(A), 10(B) and 10(C) are cross-sections showing a fabrication process for forming a microlens over a via wave guide according to another embodiment of the present invention.
Figure 10B:
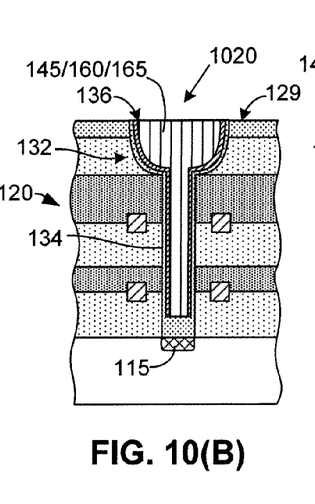
Figure 10C:
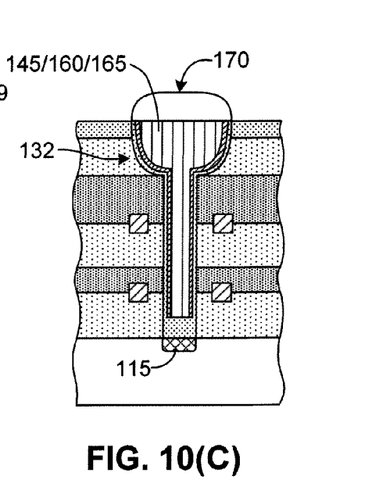

FIGS. 10(A) to 10(C) illustrate a process for forming a microlens over a via wave guide in accordance with another embodiment of the present invention. The exemplary embodiment shown in FIGS. 10(A) to 10(C) includes a mirror coating 150 inside light concentrator 132 and lower section 134. First, a support structure, comprising at least one of transparent light-guiding material 145, color filter material 160, or mixed color filter material 165 (described above), is disposed inside light concentrator 132 and lower section 134 in order to support the subsequently formed microlens. As shown in FIG. 10(A), an optional second mask 1010 is formed on upper surface 129 of metallization layer 120, and the selected support materials are deposited through a window 1015 into light concentrator 132 and lower section 134 using known techniques. In one embodiment, when light-guiding material 145 is used, the material is inserted into the VWG by spin coating without using mask 1010. Alternatively, if a photoresist is used to fill the VWG, mask 1010 may be used as shown. When color filter material or a mixture is used, then deposition by spin coating and then exposing each color using an associated mask (i.e., three masks for the three different colors). As indicated in FIG. 10(B), mask 1010 is then removed, and a planarizing process (e.g., CMP, etch back or coating with another planarizing layer) is performed using a suitable etchant 1020 such that the upper surface of material 145/160/165 located at upper opening 136 is coplanar with upper surface 129 of metallization layer 120. FIG. 10(C) illustrates the subsequent step of forming microlens 170 over planarized material 145/160/165 using known microlens forming techniques. Note that the use of microlens 170 may reduce the need for mirror coating 150, and may provide a suitable VWG structure in combination with high-RI light guiding material 140 alone (e.g., similar to VWG 130-4B, shown in FIG. 7(B)).

Although the present invention has been described with respect to certain specific embodiments, it will be clear to those skilled in the art that the inventive features of the present invention are applicable to other embodiments as well, all of which are intended to fall within the scope of the present invention. For example, although the present invention is described with specific reference to CIS devices, the present invention may be utilized to generate other types of image sensors as well. Moreover, although the ideal size of upper VWG opening 136 is substantially equal to the pixel size, the inventors believe it may in some circumstances be necessarily smaller (e.g., by 0.2 to 0.6 microns) than the pixel size due to process fabrication problems (e.g., a large etch bias can result in walls being etched completely through). Further, the dry-wet-dry etching process described above with reference to FIGS. 8(A) to 8(C) for forming parabolic light concentrators may be replaced with a dual damascene-like process.

The invention claimed is:

1. A method for fabricating a via wave guide in a CMOS image sensor (CIS), the method comprising:
    forming a sensing element in a substrate;
    forming a metallization layer over the sensing element, wherein the metallization layer includes a plurality of insulation layers and a plurality of metal lines disposed in the insulation layers, and having an upper surface;
    dry etching the metallization layer through a mask opening to define a first, relatively narrow hole through the upper surface of the metallization layer, the first hole extending a first, relatively short distance between the upper surface and the sensing element; and
    wet etching the metallization layer through the mask opening to define an light concentrator of the via wave guide, the light concentrator having a first, relatively wide opening located adjacent to the upper surface and a tapered surface extending between the upper opening and a lower opening, the lower opening being smaller than the upper opening,
    wherein defining the light concentrator comprises forming a curved surface having a shape such that light beams directed toward the curved surface are redirected by the curved surface through the lower opening.

2. A method for fabricating a via wave guide in a CMOS image sensor (CIS), the method comprising:
    forming a sensing element in a substrate;
    forming a metallization layer over the sensing element, wherein the metallization layer includes a plurality of insulation layers and a plurality of metal lines disposed in the insulation layers, and having an upper surface;
    dry etching the metallization layer through a mask opening to define a first, relatively narrow hole through the upper surface of the metallization layer, the first hole extending a first, relatively short distance between the upper surface and the sensing element; and
    wet etching the metallization layer through the mask opening to define an light concentrator of the via wave guide, the light concentrator having a first, relatively wide opening located adjacent to the upper surface and a tapered surface extending between the upper opening and a lower end,
    wherein defining the light concentrator comprises forming a parabolic surface.

3. The method of claim 1, further comprising dry etching the metallization layer through the mask opening to define an lower section of the via wave guide such that a peripheral surface of the lower section has a substantially uniform cross section extending from the lower end of the light concentrator toward the sensing element.

4. A method for fabricating a via wave guide in a CMOS image sensor (CIS), the method comprising:
    forming a sensing element in a substrate;
    forming a metallization layer over the sensing element, wherein the metallization layer includes a plurality of insulation layers and a plurality of metal lines disposed in the insulation layers, and having an upper surface;
    dry etching the metallization layer through a mask opening to define a first, relatively narrow hole through the upper surface of the metallization layer, the first hole extending a first, relatively short distance between the upper surface and the sensing element; and
    wet etching the metallization layer through the mask opening to define an light concentrator of the via wave guide, the light concentrator having a first, relatively wide opening located adjacent to the upper surface and a tapered surface extending between the upper opening and a lower end;
    dry etching the metallization layer through the mask opening to define an lower section of the via wave guide such that a peripheral surface of the lower section has a substantially uniform cross section extending from the lower end of the light concentrator toward the sensing element;
    forming a mirror coating on the curved surface of the light concentrator.

5. The method according to claim 4, wherein forming the mirror coating comprises:
    depositing a passivation layer on the curved surface of the light concentrator;
    forming a light reflective material layer on the passivation layer; and
    removing a portion of the light reflective material layer located at a lower end of the via wave guide.

6. The method according to claim 5, wherein removing the portion of the light reflective material layer located at a lower end of the via wave guide comprises:
    forming a protective layer layer over the light reflective material layer;
    dry etching the protective layer such that the portion of the light reflective material is exposed and such that a remaining portion of the protective layer remains attached to the curved surface of the light collector; and
    etching the exposed portion of the light reflective material layer such that the remaining portion of the passivation layer protects the light reflective material layer formed on the curved surface of the light collector.

7. The method according to claim 1, further comprising disposing at least one of a color filter material and a light-guiding material in the via wave guide.

8. The method according to claim 1, further comprising forming a microlens over the light concentrator of the via wave guide.

* * * * *